(12) United States Patent
Lee

(10) Patent No.: US 6,436,812 B1
(45) Date of Patent: Aug. 20, 2002

(54) METHOD OF MANUFACTURING A SEMICONDUCTOR DEVICE USING ANTI-REFLECTIVE LAYER AND SELF-ALIGNED CONTACT TECHNIQUE AND SEMICONDUCTOR DEVICE MANUFACTURED THEREBY

(75) Inventor: Se-Hyeong Lee, Sungnam-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/834,879

(22) Filed: Apr. 16, 2001

(30) Foreign Application Priority Data

Dec. 7, 2000 (KR) ............................................ 00-74165

(51) Int. Cl.[7] ............................................. H01L 23/58
(52) U.S. Cl. ...................................................... 438/636
(58) Field of Search ................................ 438/636, 637, 438/639, 595

(56) References Cited

U.S. PATENT DOCUMENTS

| | | | | |
|---|---|---|---|---|
| 5,911,887 A | * | 6/1999 | Smith et al. ................... | 216/72 |
| 6,136,676 A | * | 10/2000 | Saito ............................ | 438/587 |
| 6,136,679 A | * | 10/2000 | Yu et al. ...................... | 438/592 |
| 6,204,161 B1 | * | 3/2001 | Chung et al. ................ | 438/612 |
| 6,331,478 B1 | * | 12/2001 | Lee et al. .................... | 438/592 |
| 6,337,282 B2 | * | 1/2002 | Kim et al. ................... | 438/699 |

* cited by examiner

Primary Examiner—Hoai V. Ho
Assistant Examiner—Thao P Le
(74) Attorney, Agent, or Firm—Volentine Francos, PLLC

(57) ABSTRACT

A method of manufacturing a semiconductor device includes sequential steps of forming a gate insulating layer, a first conductive layer, an etch stop layer, a hard mask layer, and an anti-reflective layer on a semiconductor substrate. The anti-reflective layer, hard mask layer, and etch stop layer are then partially etched according to a pattern to create an anti-reflective layer pattern, hard mask layer pattern, and etch stop layer pattern. The anti-reflective layer can be formed of a porous plasma silicon oxinitride layer to keep irregular reflections to a minimum. The anti-reflective layer pattern is then etched, followed by an etching of the first conductive layer to form a gate electrode under the etch stop layer pattern. A conformal spacer insulating layer is formed on the whole surface of the semiconductor substrate, and an interlayer insulating layer is formed on the spacer insulating layer so as to fill openings between the gate electrodes. The interlayer insulating layer, the spacer insulating layer and the hard mask pattern are etched using the etch stop layer pattern as an etch mask, and thereby forming self-aligned contact holes exposing the semiconductor substrate between the gate electrodes.

18 Claims, 7 Drawing Sheets

METHOD OF MANUFACTURING A SEMICONDUCTOR DEVICE USING ANTI-REFLECTIVE LAYER AND SELF-ALIGNED CONTACT TECHNIQUE AND SEMICONDUCTOR DEVICE MANUFACTURED THEREBY

This application is a counterpart of, and claims priority to, Korean Patent Application No. 2000-74165, filed on Dec. 7, 2000, the contents of which are herein incorporated by reference in their entirety.

BACKGROUND OF THE INVENTION

1. Field of the Invention

The present invention relates to method of manufacturing a semiconductor device and semiconductor device manufactured thereby, and more particularly to method of manufacturing a semiconductor device using an anti-reflective layer and a self-aligned contact technique, and the resulting semiconductor device.

2. Description of the Related Art

As semiconductor devices become more densely integrated, techniques of forming self-aligned contact holes for electrically connecting different conductive layers become increasingly important. The use of a SAC (self-aligned contact) allows the amount of source and drain contact area to be reduced, thus allowing smaller devices to be constructed.

FIGS. 1 to 5 are flow diagrams showing the process steps of a conventional method of manufacturing a DRAM (dynamic random access memory) device using a self-aligned contact technique. Each figure shows a cell array area of a DRAM device.

In FIG. 1, a device isolation layer 3 is formed on a semiconductor substrate 1 to define an active and an inactive region. A gate insulating layer 5, for example, a gate oxide layer, is formed on the active region of the semiconductor substrate 1. Then, a conductive layer 7, an etch stop layer 9, a hard mask layer 11, and an anti-reflective layer 13 are sequentially formed on the semiconductor substrate 1 on which the gate insulating layer 5 is formed. In order to define gate pattern, i.e., word lines, a first photoresist pattern 15 is formed on the anti-reflective layer 13.

The etch stop layer 9 is formed of an insulating layer, for example, a silicon nitride layer, which has an etch selectivity with respect to a silicon oxide layer. The hard mask layer 11 is formed of an insulating layer, for example a CVD (chemical vapor deposition) oxide layer, which has an etch selectivity with respect to the conductive layer 7. The anti-reflective layer 13 is composed of material that reduces irregular reflections and keeps them to a minimum during the photolithography process, for example, a silicon oxinitride layer formed by a plasma CVD process. It is known that silicon oxynitride formed by a plasma CVD process exhibits good anti-reflective characteristics. However, it is also known that the leakage current characteristic of the insulating layer formed by plasma CVD process is poor since it is porous compared with an insulating layer formed by a low-pressure CVD process.

In FIG. 2, the anti-reflective layer 13, hard mask layer 11 and etch stop layer 9 are continuously etched using the photoresist pattern 15 as a mask. As a result, etch stop layer pattern 9a, hard mask layer pattern 11a, and anti-reflective layer pattern 13a are sequentially formed in order on the conductive layer 7. Thereafter, the photoresist pattern 15 is removed.

In FIG. 3, gate electrode 7a is formed by selectively etching the conductive layer 7 under openings or gaps between the etch stop layer patterns 9a. At this time, the anti-reflective layer pattern 13a remains on the hard mask layer pattern 11a. Gate pattern 14—comprising gate electrode 7a, the etch stop layer pattern 9a, the hard mask layer pattern 11a, and the anti-reflective layer pattern 13a—is formed on the gate insulating layer 5. A gate pattern (not shown) is also formed on a peripheral circuit area of the semiconductor device.

A conformal spacer insulating layer 17 is then formed on the whole surface of the resultant structure on which the gate pattern 14 is disposed. An interlayer insulating layer 19, for example a CVD oxide layer, is formed on the spacer insulating layer 17.

In the peripheral circuit area, spacers (not shown) are formed on side walls of a gate pattern by anisotropically etching a spacer insulating layer in the peripheral circuit area, before the interlayer insulating layer 19 in the cell array area is formed. The spacers are not formed in the cell array area at the same time that they are formed in the peripheral circuit area, because the semiconductor substrate in the cell array area can be damaged due to the anisotropic etch process. If this etch damage occurs, the contact leakage current characteristic of a cell transistor is deteriorated, thereby causing a problem wherein the refresh period of the DRAM device is shortened. To solve this problem, a widely used technique forms spacers only on side walls of the gate pattern in the peripheral circuit area. Thereafter, a second photoresist pattern 21 is formed on the interlayer insulating layer 19 to define self-aligned contact holes.

In FIG. 4, self-aligned contact holes 23 are formed by an anisotropic etch process in which the interlayer insulating layer 19, spacer insulating layer 17 and gate oxide layer 5 are continuously etched using the second photoresist patterns 21 as a mask so as to expose the semiconductor substrate under openings or gaps of the gate pattern 14. The etch stop layer pattern 9a functions as an etch stop layer.

Accordingly, spacers 17a are formed on side walls of the etch stop pattern 9a and the gate electrode 7a. Also, edges of the hard mask layer pattern 11a and anti-reflective layer pattern 13a, which are disposed on the etch stop layer pattern 9a, can be etched. Thereafter, the second photoresist pattern 21 is removed.

In FIG. 5, a conductive layer, for example a polysilicon layer, is formed on the interlayer insulating layer 19 to fill in the self-aligned contact holes 23. Conductive pads 25 are formed in the self-aligned contact holes 23 by completely etching the conductive layer and interlayer insulating layer 19 until the spacer insulating layer 17 on the gate pattern 14 is exposed. The anti-reflective layer pattern 13a remains between adjacent conductive pads 25.

As is apparent from the foregoing description, in the conventional method of manufacturing a semiconductor device, the anti-reflective layer pattern 13a formed by a plasma CVD process remains between adjacent conductive pads 25. Accordingly, the leakage current characteristic between conductive pads is deteriorated, thereby causing a problem wherein the refresh period of the DRAM device is shortened.

SUMMARY OF THE INVENTION

It is an object of the present invention to provide an improved method of manufacturing a semiconductor device which does not have an anti-reflective layer pattern, such as a porous insulating layer, between adjacent conductive pads, thereby improving the leakage current characteristic between adjacent conductive pads.

It is another object of the present invention to provide an improved semiconductor device itself which does not have an anti-reflective layer pattern, such as a porous insulating layer, between adjacent conductive pads, thereby improving the leakage current characteristic between adjacent conductive pads.

To achieve these and other objects, the present invention provides a method of manufacturing a semiconductor device using a self-aligned contact technique. The method includes steps of sequentially forming a gate insulating layer, a first conductive layer, an etch stop layer, a hard mask layer, and an anti-reflective layer on a semiconductor substrate, and then sequentially forming an etch stop layer pattern, hard mask layer pattern, and anti-reflective layer pattern by partially etching the etch stop layer, the hard mask layer, and the anti-reflective layer. The anti-reflective layer pattern can be formed of an inorganic anti-reflective layer or an organic anti-reflective layer.

The method further includes steps of etching the anti-reflective layer pattern and the first conductive layer to form a gate electrode under the etch stop layer pattern, forming a conformal spacer insulating layer on the whole surface of the semiconductor substrate on which the gate electrodes are formed, and forming an interlayer insulating layer on the spacer insulating layer so as to fill in the openings between the gate electrodes. In addition, the interlayer insulating layer, the spacer insulating layer and the hard mask layer pattern are etched using the etch stop layer pattern as an etching mask, thereby forming self-aligned contact holes that expose the semiconductor substrate between the gate electrodes and concurrently forming spacer on side walls of the gate electrodes and the etch stop layer patterns.

The step of forming the self-aligned contact holes is performed on condition that the interlayer insulating layer, the spacer insulating layer and the hard mask layer pattern have an etch selectivity with respect to the etch stop layer pattern. Therefore, it is possible to prevent upper surfaces of the gate electrodes from being exposed.

The anti-reflective layer pattern can be etched using a separate etch process before the first conductive layer is etched. This separate etch process removes a portion of the anti-reflective layer pattern, with the remaining portion of the anti-reflective layer being completely removed during the step for etching the first conductive layer. Alternatively, the first conductive layer can be etched after the anti-reflective layer pattern is completely removed such that the hard mask layer pattern is exposed.

Preferably, the steps of etching the anti-reflective layer pattern and the first conductive layer are performed by an in-situ process.

According to the present invention, the resulting semiconductor device has a gate pattern formed on a semiconductor substrate, and a spacer insulating layer disposed on the gate pattern. The gate pattern includes a gate electrode, an etch stop layer pattern, and a hard mask pattern, which are sequentially stacked. Spacers are formed on side walls of the gate electrodes and the etch stop layer pattern. Conductive pads are electrically connected with the semiconductor substrate to fill in given areas between the gate patterns.

DETAILED DESCRIPTION OF PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
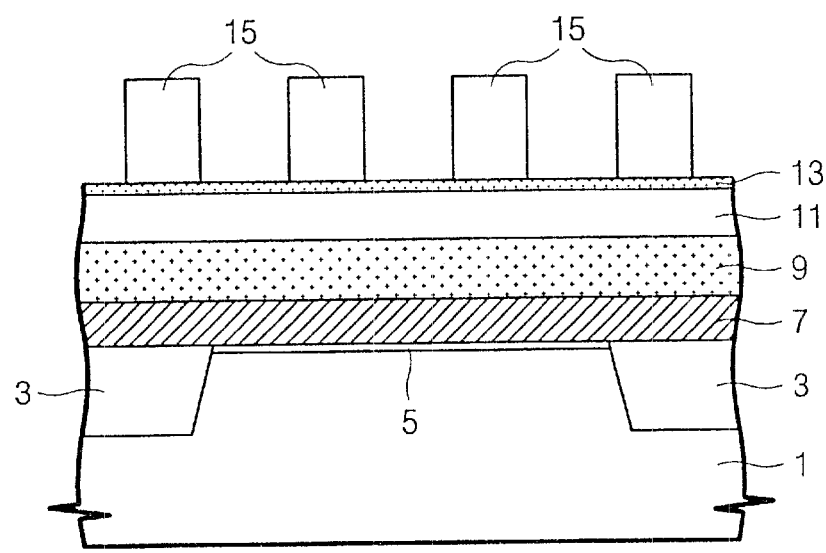
FIG. 1 through FIG. 5 are flow diagrams showing the process steps of a conventional method of manufacturing a semiconductor device.
Figure 2:
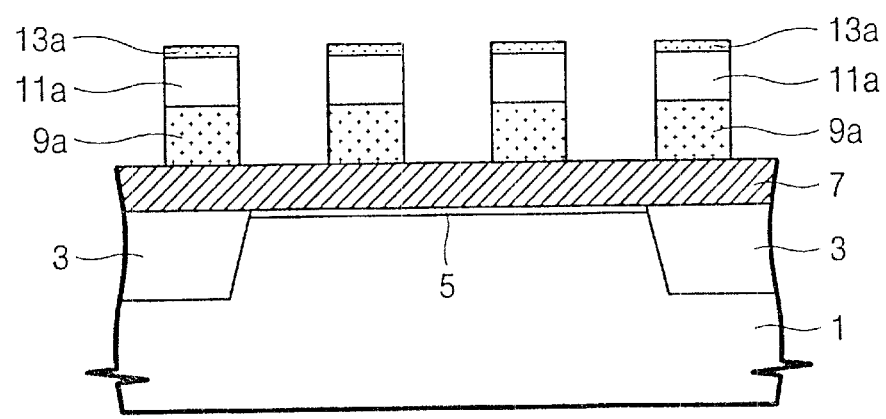
Figure 3:
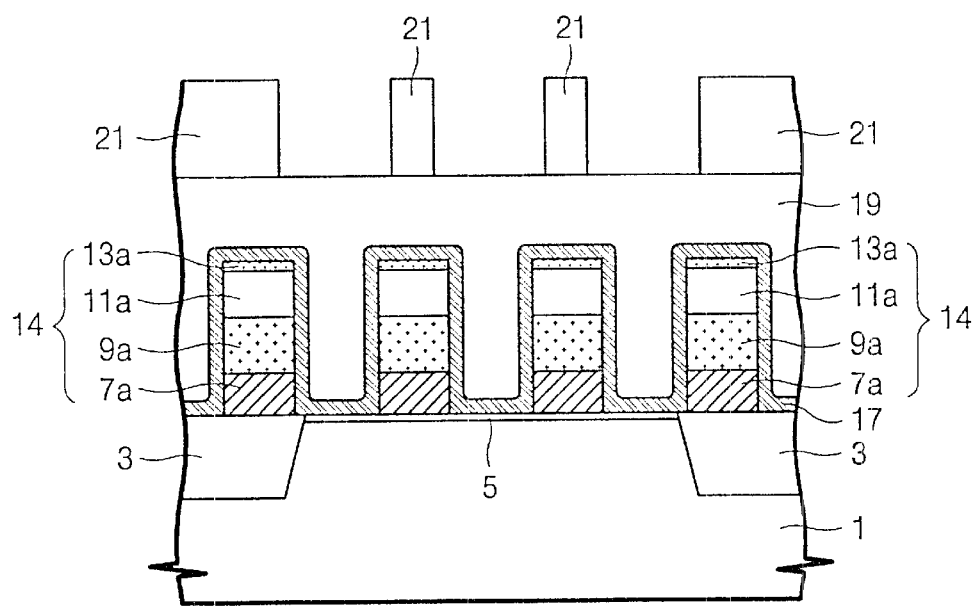
Figure 4:
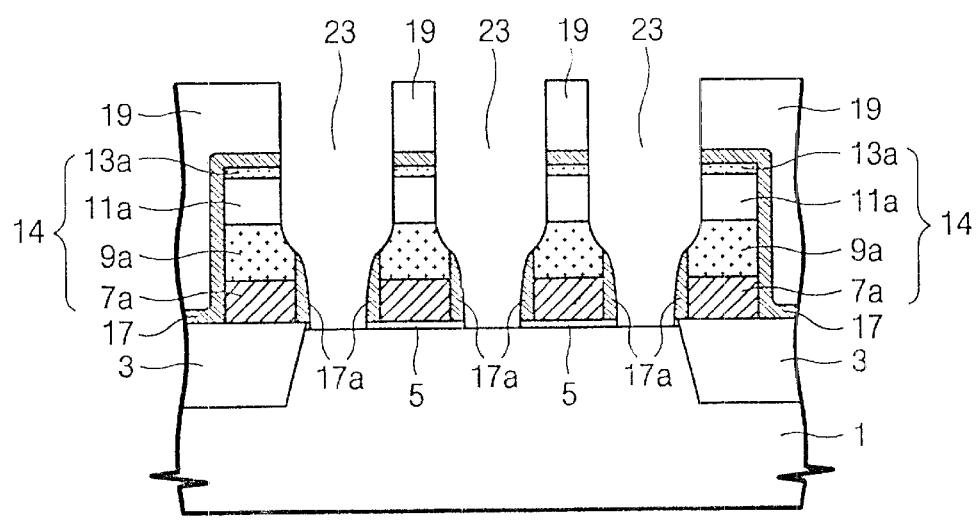
Figure 5:
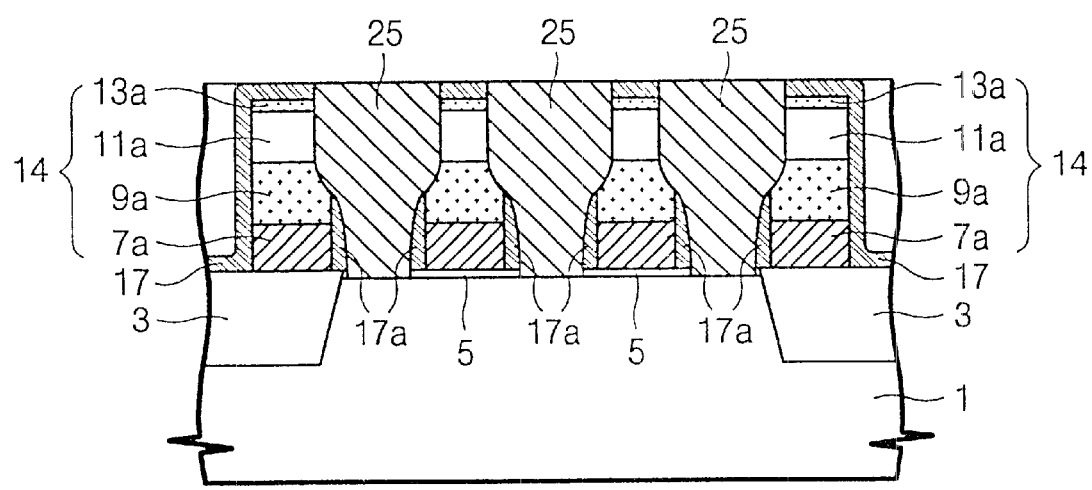
Figure 6A:
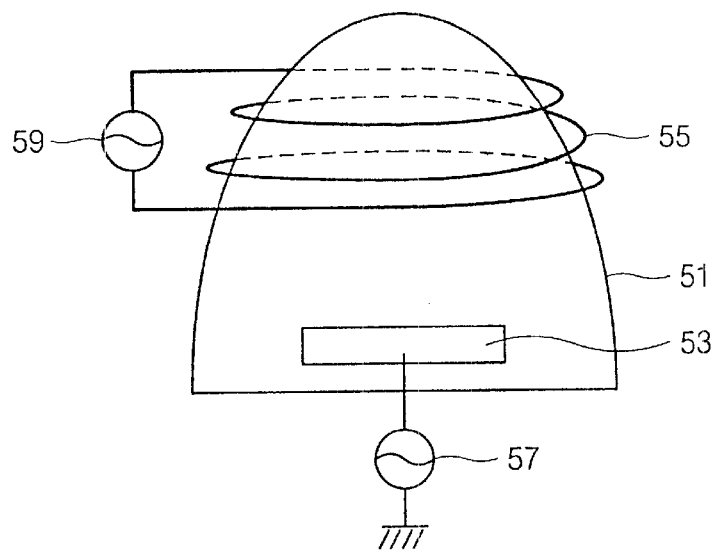
FIG. 6A is a schematic diagram illustrating de-coupled plasma source equipment, which is used in general dry etch processes.
Figure 6B:
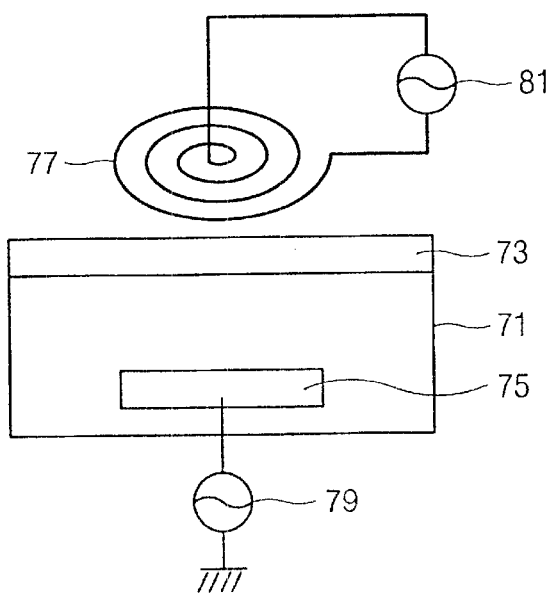
FIG. 6B is a schematic diagram illustrating transformer coupled plasma equipment, which is used in general dry etch processes.

FIGS. 6A and 6B are schematic diagrams illustrating general types of etch equipment used in etch processes for removing an anti-reflective pattern from a semiconductor device. FIG. 6A is a schematic diagram of de-coupled plasma source equipment, and FIG. 6B is a schematic diagram of transformer coupled plasma equipment.

In FIG. 6A, a dome-shaped etch chamber 51 is surrounded by an induction coil 55. The induction coil 55 is connected to a power source 59. A chuck 53 for supporting a semiconductor substrate (not shown) is disposed in the etch chamber 51, and is connected to a bias power 57. When radio frequency power is supplied to the induction coil 55 by power source 59, a source gas which is injected in the etch chamber 51 is ionized to form the plasma. Also, when radio frequency power is supplied to the chuck 53 by the bias power 57, ions in the plasma are accelerated in a direction vertical to the surface of the chuck 53, allowing an etch process to be performed.

In FIG. 6B, a chuck 75 is disposed in an etch chamber 71 having an upper opening. The chuck 75 is connected to a bias power 79. The upper opening is covered with a chamber lid 73. An induction coil 77, which is connected to a power source 81, is disposed over the chamber lid 73. The resulting operation of the transformer coupled plasma equipment of FIG. 6B is the same as that of de-coupled plasma source equipment of FIG. 6A. In the discussion below, the method of manufacturing a semiconductor device in accordance with the present invention will be described with respect to the de-coupled plasma source equipment of FIG. 6A.

FIGS. 7 to 12 are flow diagrams showing the process steps of a method of manufacturing a semiconductor device in accordance with the present invention. Each drawing shows a cell array area of a DRAM device.

Figure 7:
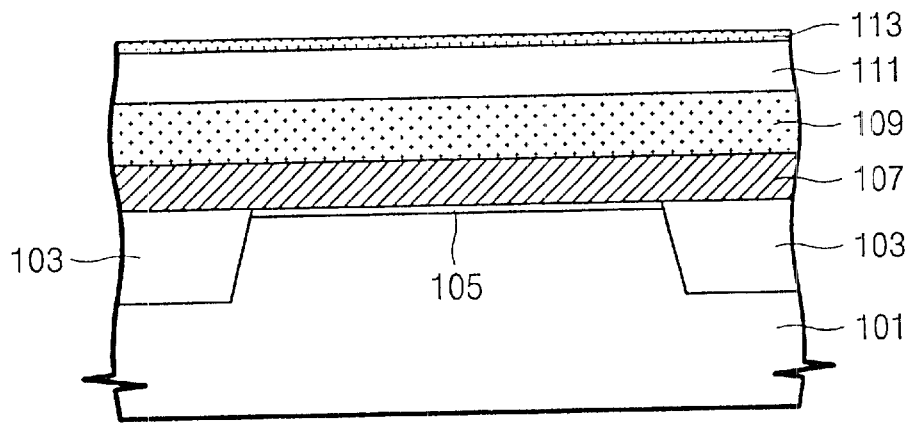
FIG. 7 through FIG. 12 are flow diagrams showing the process steps of a method of manufacturing a semiconductor device in accordance with the present invention.

In FIG. 7, a device isolation layer 103 is formed on a semiconductor substrate 101 to define an active and an inactive region. A gate oxide layer 105 is formed on the active region of the semiconductor substrate 101. Then, a first conductive layer 107, an etch stop layer 109, a hard mask layer 111, and an anti-reflective layer 113 are sequentially formed on gate oxide layer 105.

The first conductive layer 107 is formed of a doped polysilicon layer or a metal polycide layer.

The etch stop layer 109 is formed of an insulating layer, for example, a silicon nitride layer, which has an etch selectivity with respect to a silicon oxide layer. Preferably, the etch stop layer 109 is formed of a silicon nitride layer by a low pressure CVD process.

The hard mask layer 111 is formed of an insulating layer, for example, a CVD oxide layer, which has an etch selectivity with respect to the first conductive layer 107.

The anti-reflective layer 113 is formed of material which reduces irregular reflections to a minimum during a photolithography process. For example, the anti-reflective layer 113 may be composed of an inorganic anti-reflective layer such as a silicon oxinitride layer formed by a plasma CVD process (plasma CVD SiON). Alternatively, the anti-reflective layer 113 may be composed of an organic anti-reflective layer. The plasma CVD silicon oxinitride layer has good anti-reflective characteristics, but it is porous since it is formed at a low temperature below about 400° C. Accordingly, the leakage current characteristic of a plasma CVD silicon oxinitride layer is poor compared with that of a silicon nitride layer formed by a low pressure CVD process (LPCVD SiN). It is preferable that the anti-reflective layer 113 has a thickness of about 600 Å, but it may be less than 500 Å, for example, even as little as 300 Å.

Figure 8:
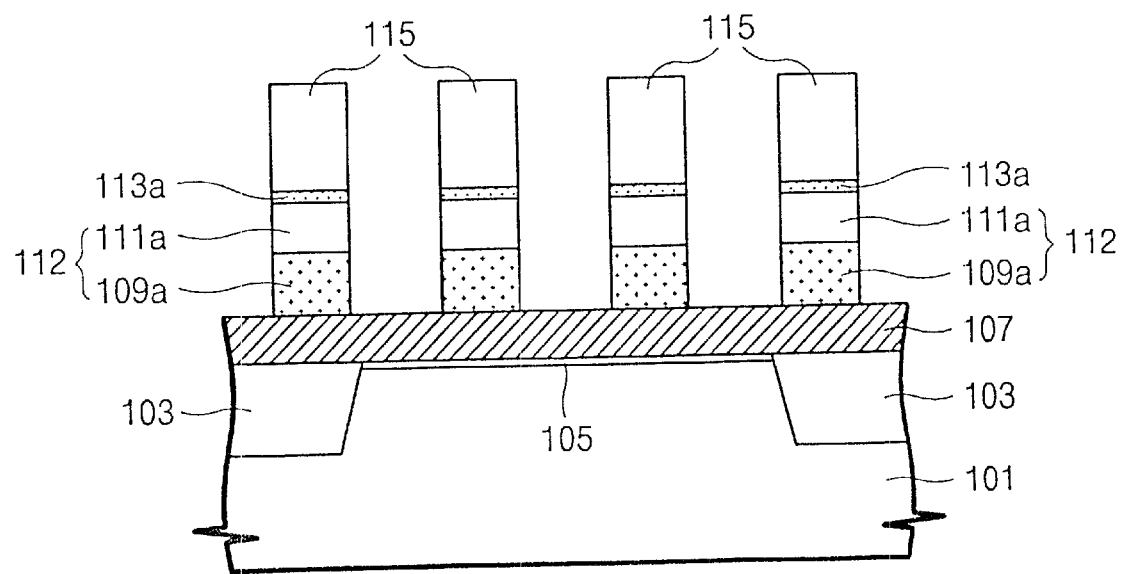

In FIG. 8, a first photoresist pattern 115 is formed on the anti-reflective layer 113. The anti-reflective layer 113, hard mask layer 111 and etch stop layer 109 are continuously etched using the photoresist patterns 115 as a mask.

As a result, a capping layer pattern 112 and an anti-reflective layer pattern 113a are sequentially formed on the conductive layer 107. The capping layer pattern 112 includes an etch stop layer pattern 109a and a hard mask layer pattern 111a, which are disposed in order. The etch process for forming the capping layer pattern 112 and the anti-reflective layer pattern 113a uses general dry etch processing techniques employing $CF_4$ gas and $CHF_3$ gas.

Figure 9:
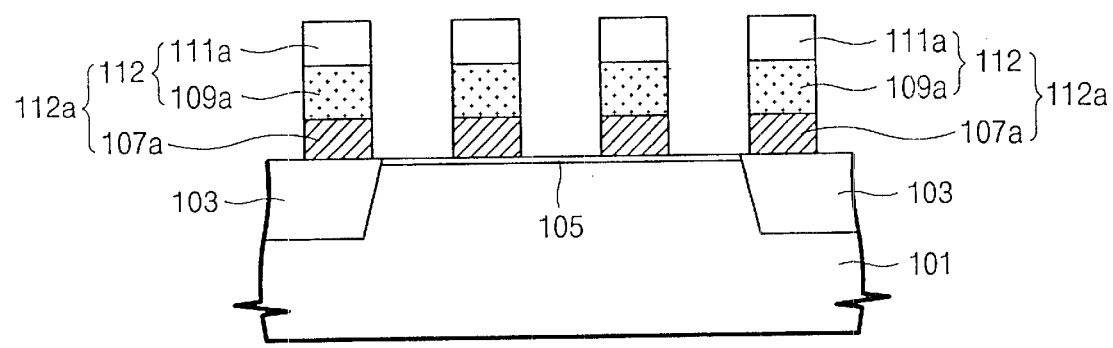

In FIG. 9, the photoresist pattern 115 is removed. The anti-reflective layer pattern 113a is then removed to expose an upper surface of the hard mask layer pattern 111a. A wet etch process, using a solution of phosphoric acid ($H_3PO_4$), is employed to remove the anti-reflective layer pattern 113a. Alternatively, the anti-reflective layer pattern 113a can be removed using a dry etch process employing the de-coupled plasma source equipment of FIG. 6A or the transformer coupled plasma equipment of FIG. 6B. $CF_4$ gas, or a mixed gas including $CF_4$ gas and $SF_6$ gas, is used as a process gas for etching the anti-reflective layer pattern 113a, i.e., the plasma CVD oxinitride layer.

When the thickness of the anti-reflective layer pattern 113a is greater than 500, it is preferable to ensure the anti-reflective layer pattern 113a is not completely removed during the etch process. This is because if the anti-reflective layer pattern 113a is etched excessively by the $CF_4$ gas, the first conductive layer 107 can be isotropically etched. If the first conductive layer 107 is isotropically etched during the etch process, the side walls of gate electrodes formed during subsequent process steps will have a recessed profile. Accordingly, when the thickness of the anti-reflective layer pattern 113a is greater than 500, it is preferable that the anti-reflective layer pattern 113a is appropriately etched so that anti-reflective layer pattern 113a having a thickness less than 500 remains on the hard mask layer pattern 111a.

In operation, when the anti-reflective layer pattern 113a is etched or removed by using the de-coupled plasma source equipment, the semiconductor substrate from which the first photoresist pattern 115 is removed is disposed on the chuck 53 in the etch chamber 51. Thereafter, an etch gas, for example, $CF_4$ gas or a mixed gas including $CF_4$ gas and $SF_6$ gas, is injected into the etch chamber 51. A source power of 200 W–800 W, preferably about 600 W, and a bias power of 60 W–300 W, preferably about 80 W, are supplied respectively to the induction coil 55 and the chuck 53. The pressure in etch chamber 51 is controlled to 5 mTorr60 mTorr, preferably about 10 mTorr. Then, the anti-reflective layer pattern 113a is selectively removed.

Gate electrode 107a is formed under the capping layer pattern 112 by etching the first conductive layer 107 using the hard mask layer pattern 111a as a mask. A gate pattern 112a includes the gate electrode structure 107a and the capping layer pattern 112.

Another gate pattern (not shown) is also formed on a peripheral circuit area of the semiconductor substrate. When the first conductive layer 107 is a tungsten polycide layer, the first conductive layer 107 is etched using a mixed gas including chlorine gas and $SF_6$ gas. Alternatively, the tungsten polycide layer can be etched using a mixed gas including chlorine gas and HBr gas.

Also, the processes for removing the anti-reflective layer pattern 113a and the first conductive layer 107 can be carried out in-situ. The in-situ process includes two dry etch steps which are continuously carried out in an etch chamber. One dry etch step is carried out by etching the anti-reflective layer pattern 113a using CF4 gas, whereas another dry etch step is carried out by etching the first conductive layer 107 using chlorine gas. In the latter step, the first conductive layer 107 is etched on condition that it has a low etch selectivity with respect to the anti-reflective layer pattern 113a composed of a plasma CVD oxinitride layer. As a result, the anti-reflective layer pattern 113a, with a thickness of less than 500, remaining on the hard mask layer pattern 111a, can be easily removed while the first conductive layer 107 is etched.

When the anti-reflective layer 113 of FIG. 7 has a thickness less than 500 Å, the anti-reflective layer pattern 113a can be easily removed while the first conductive layer 107 is etched, without requiring the separate etch step of selectively etching the anti-reflective layer pattern 113a. In addition, when the anti-reflective layer 113 is formed of an organic anti-reflective layer, the anti-reflective layer pattern 113a is removed regardless of the thickness thereof while the first photoresist pattern 115 is etched. Thus, there is no need for a separate etch step of selectively etching the anti-reflective layer pattern 113a.

Figure 10:
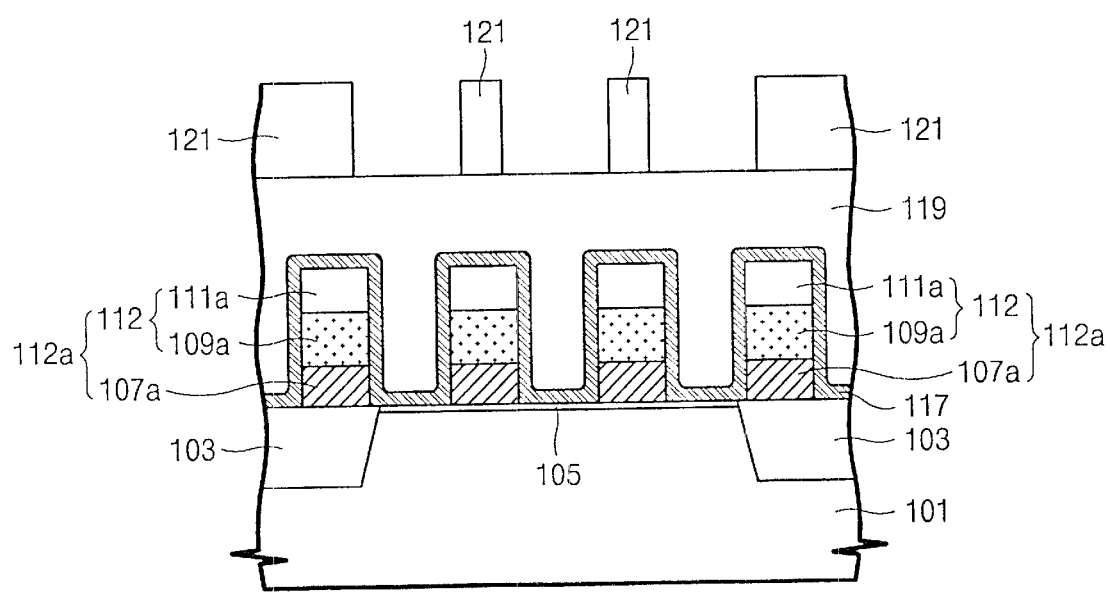

In FIG. 10, a conformal spacer insulating layer 117 is formed on the whole surface of the resultant structure on which the gate pattern 112a is formed. Preferably, the spacer insulating layer 117 is composed of a silicon nitride layer formed by a low pressure CVD process. In the peripheral circuit area, spacers (not shown) are formed on side walls of the gate pattern by anisotropically etching the spacer insulating layer 117. The reason spacers are only formed in the peripheral circuit area at this point is that forming spacers in the cell array area at this time can damage the semiconductor substrate due to the anisotropic etch process.

An interlayer insulating layer 119 is formed on the resultant structure including the spacers in the peripheral circuit area, in order to fill in openings or gaps between the gate patterns 112a. Preferably, the interlayer insulating layer 119 is formed of a CVD silicon oxide layer. Then, a second photoresist pattern 121, which has openings for exposing given portions of the interlayer insulating layer 119 in the cell array area of the semiconductor substrate, is formed on the interlayer insulating layer 119.

Figure 11:
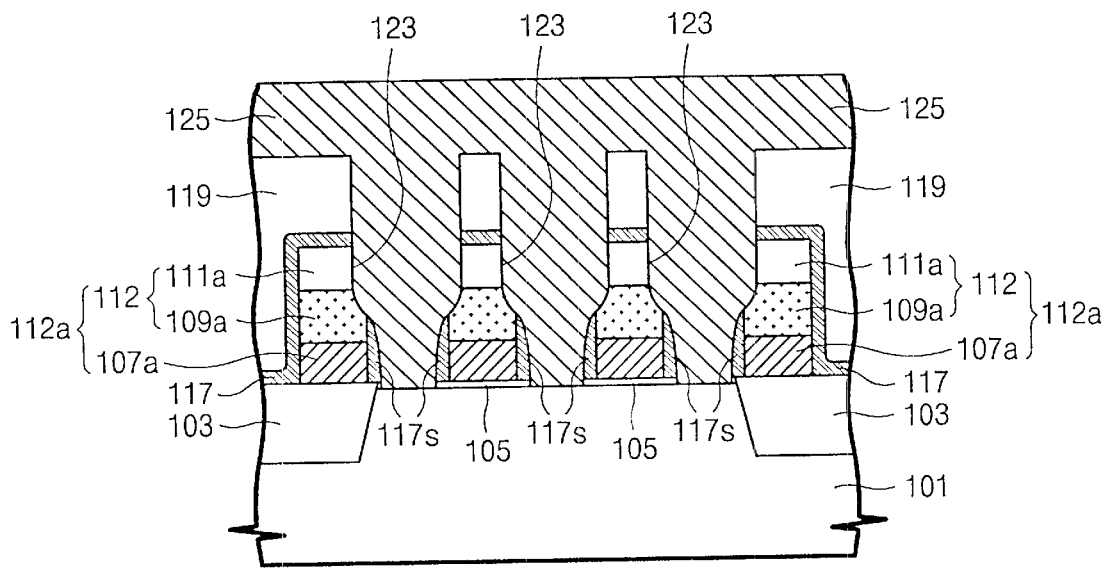

In FIG. 11, the interlayer insulating layer 119, spacer insulating layer 117, and gate insulating layer 105 are sequentially etched using the second photoresist pattern 121 as a mask, thereby forming self-aligned contact holes 123 that expose the active region of the semiconductor substrate below openings between the gate patterns 112a.

At this time, spacers 117s are formed on side walls of gate electrode 107a and the etch stop pattern 109a. Also, edges of the hard mask pattern 111a can be etched, as shown in FIG. 11. Thereafter, the second conductive layer 125, for example a doped polysilicon layer, is formed on the resultant structure on which the self-aligned contact holes are formed.

Figure 12:
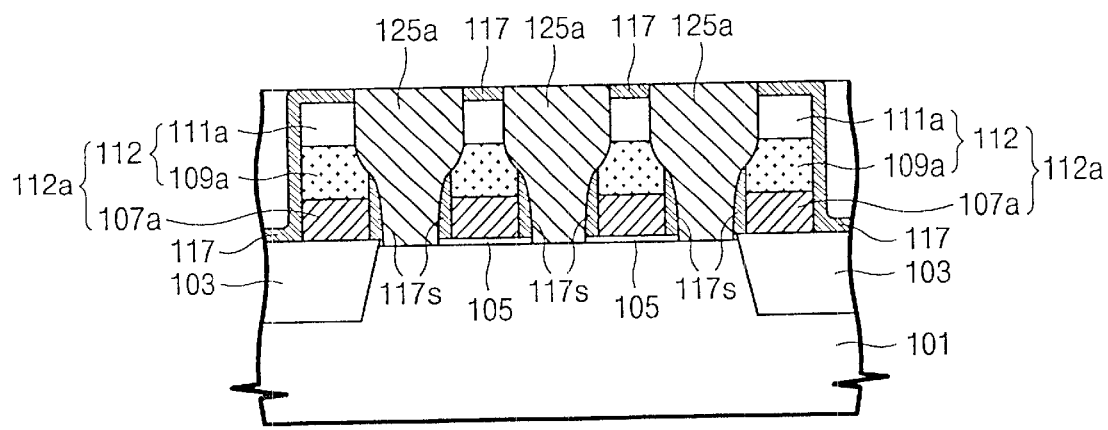

In FIG. 12, conductive pads 125a are formed in the self-aligned contact holes 123 by completely etching the second conductive layer 125 and the interlayer insulating layer 119 until the spacer insulating layer 117 on the gate pattern 112a is exposed. As a result, adjacent conductive pads 125a are separated from each other by the gate pattern 112a and the spacer insulating layer 117. Thereafter, bit lines and storage nodes (not shown), which are disposed on the conductive pads 125a and electrically connected thereto, are formed in the manner as known in the art.

A preferred embodiment of a semiconductor device manufactured in accordance with the present invention will now be explained. Referring to FIG. 12, there is illustrated a semiconductor device manufactured in accordance with the present invention. A device isolation layer 103 is disposed on a semiconductor substrate 101 to define an active and an inactive region. A plurality of parallel gate patterns 112a cross over the active region. Each of the gate patterns 112a comprises a gate electrode 107a and a capping layer pattern 112 which are sequentially stacked. The capping layer pattern 112 comprises an etch stop layer pattern 109a and a hard mask pattern 111a which are sequentially stacked. A gate insulating layer 105 is interposed between the gate electrode 107a and the active region. Also, a spacer insulating layer 117 is located on the gate pattern 112a, and sidewalls of the gate electrode 107a and the etch stop layer pattern 109a are covered with a spacer 117s. Thus, the gate electrode 107a is surrounded by the spacer 117s and the etch stop layer pattern 109a. A gap region between the gate patterns 112a is filled with a conductive pad 125a, and the conductive pad 125a is in contact with the active region, i.e., the semiconductor substrate 101 between the gate patterns 112a. As a result, the adjacent conductive pads 125a are separated from each other by the gate pattern 112a and the spacer insulating layer 117 on the gate pattern 112a.

As apparent from the foregoing description, the present invention provides an improved semiconductor device and a manufacturing method therefor which do not have an anti-reflective layer pattern 113a such as a porous insulating layer between adjacent conductive pads 125a, thereby improving the leakage current characteristic between adjacent conductive pads.

In the drawings and specification, there has been disclosed typical preferred embodiment of the invention and, although specific terms are employed, they are used in a generic and descriptive sense only and not for purpose of limitation, the scope of the invention being set forth in the following claims.

What is claimed is:

1. A method of manufacturing a semiconductor device, comprising the steps of:
    forming, in sequential order, a gate insulating layer, a first conductive layer, an etch stop layer, a hard mask layer, and an anti-reflective layer on a semiconductor substrate;
    partially etching, in sequential order, said anti-reflective layer, said hard mask layer, and said etch stop layer, to form a plurality of parallel etch stop layer patterns and concurrently form a hard mask layer pattern and an anti-reflective layer pattern which are sequentially stacked on each of said etch stop layer patterns;
    etching said anti-reflective layer pattern;
    etching said first conductive layer to form a gate electrode under said etch stop layer patterns, with openings separating adjacent gate electrodes;
    forming a conformal spacer insulating layer on the whole surface of said semiconductor substrate on which said gate electrodes are formed;
    forming an interlayer insulating layer on said spacer insulating layer so as to fill in the openings between said gate electrodes; and
    etching said interlayer insulating layer, said spacer insulating layer and said hard mask layer pattern using said etch stop layer patterns as a mask, thereby forming self-aligned contact holes exposing said semiconductor substrate between said gate electrodes, and forming spacers on side walls of said gate electrodes and said etch stop layer patterns.

2. The method of claim 1, wherein said first conductive layer is formed of one of a polysilicon layer and a polycide layer.

3. The method of claim 1, wherein said etch stop layer is formed of an insulating layer with an etch selectivity with respect to a silicon oxide layer.

4. The method of claim 1, wherein said etch stop layer is a silicon nitride layer formed by a low pressure CVD process.

5. The method of claim 1, wherein said hard mask layer is formed of a CVD oxide layer.

6. The method of claim 1, wherein said anti-reflective layer is formed of one of an inorganic anti-reflective layer and an organic anti-reflective layer.

7. The method of claim 6, wherein said inorganic anti-reflective layer is a silicon oxinitride layer formed by a plasma CVD process.

8. The method of claim 6, wherein said inorganic anti-reflective layer is formed to a thickness greater than 500 Å.

9. The method of claim 8, wherein said step of etching said anti-reflective layer pattern is performed using a dry etch process until said hard mask layer pattern is exposed.

10. The method of claim 8, wherein said step of etching said anti-reflective layer pattern is performed using a wet etch process until said hard mask layer pattern is exposed.

11. The method of claim 9, wherein said dry etch process is performed using one of $CF_4$ gas, and a mixed gas including $SF_6$ gas and $CF_4$ gas, as an etch gas.

12. The method of claim 10, wherein said wet etch process is performed using a solution of phosphoric acid ($H_3PO_4$).

13. The method of claim 11, wherein said step of etching said anti-reflective layer pattern and said step of etching said first conductive layer are performed by an in-situ process.

14. The method of claim 8, wherein said step of etching said anti-reflective layer pattern is performed for a time sufficient to reduce the thickness of a remaining anti-reflective layer pattern to less than 500 Å, and said remaining anti-reflective layer pattern is completely removed during said step of etching said first conductive layer.

15. The method of claim 6, wherein said inorganic anti-reflective layer is formed to a thickness less than 500 Å.

16. The method of claim 15, wherein said anti-reflective layer pattern is removed during said step of etching said first conductive layer.

17. The method of claim 13, wherein said in-situ process comprises:

loading said semiconductor substrate on which said anti-reflective layer pattern is formed, into an etch chamber;

injecting one of $CF_4$ gas, and a mixed gas including $SF_6$ gas and $CF_4$ gas, into said etch chamber to etch said anti-reflective layer pattern; and etching said first conductive layer.

18. The method of claim 1, further comprising the steps of:

forming a second conductive layer on the whole surface of said semiconductor substrate so as to fill in said self-aligned contact holes after said self-aligned contact holes are formed; and etching said second conductive layer and said interlayer insulating layer until said spacer insulating layer is exposed, to thereby form conductive pads in said self-aligned contact holes.

* * * * *